United States Patent
Gäbler et al.

(10) Patent No.: US 11,575,061 B2
(45) Date of Patent: Feb. 7, 2023

(54) SINGLE PHOTON AVALANCHE DIODE DEVICES

(71) Applicant: X-FAB Semiconductor Foundries GmbH, Erfurt (DE)

(72) Inventors: Daniel Gäbler, Apolda (DE); Hannes Schmidt, Erfurt (DE); Pablo Siles, Erfurt (DE); Matthias Krojer, Ilmenau (DE); Alexander Zimmer, Rudolstadt (DE)

(73) Assignee: X-FAB SEMICONDUCTOR FOUNDRIES GMBH, Erfurt (DE)

( * ) Notice: Subject to any disclaimer, the term of this patent is extended or adjusted under 35 U.S.C. 154(b) by 110 days.

(21) Appl. No.: 16/910,167

(22) Filed: Jun. 24, 2020

(65) Prior Publication Data
US 2020/0411710 A1    Dec. 31, 2020

(30) Foreign Application Priority Data

Jun. 26, 2019 (GB) ...................... 1909183

(51) Int. Cl.
*H01L 31/107* (2006.01)
*H01L 27/144* (2006.01)
(Continued)

(52) U.S. Cl.
CPC ...... *H01L 31/1075* (2013.01); *H01L 27/1443* (2013.01); *H01L 27/1446* (2013.01); *H01L 27/14623* (2013.01); *H01L 27/14643* (2013.01); *H01L 31/02027* (2013.01); *H01L 31/02164* (2013.01)

(58) Field of Classification Search
CPC ........... H01L 31/1075; H01L 31/02027; H01L 31/02164; H01L 31/02162; H01L 31/02327; H01L 31/107; H01L 27/1443; H01L 27/1446; H01L 27/14623; H01L 27/14643
See application file for complete search history.

(56) References Cited

U.S. PATENT DOCUMENTS 4,078,243 A *  3/1978  De Bar ............ H01L 27/14692
                                              257/E21.531
6,326,654 B1 * 12/2001  Ruden ................. H01L 31/0304
                                              257/233
(Continued)

FOREIGN PATENT DOCUMENTS

CN        109253807       1/2019
EP        3442032         2/2019
WO  WO-2014101097 A1 *  7/2014  ....... H01L 27/14685

OTHER PUBLICATIONS

Combined Search and Examination Report for corresponding United Kingdom Application No. GB 1909183.4, dated Oct. 24, 2019, 5 pages.

*Primary Examiner* — Sitaramarao S Yechuri
(74) *Attorney, Agent, or Firm* — Dority & Manning, P.A.

(57) ABSTRACT

A single photon avalanche diode (SPAD) device comprises: a silicon layer; an active region in said silicon layer for detecting incident light; and a blocking structure overlapping said active region for blocking incident light having a wavelength at least in the range of 200 nm to 400 nm, so that light having said wavelength can only be detected by said SPAD device when incident upon a region of said silicon layer outside of said active region.

20 Claims, 6 Drawing Sheets

(51) Int. Cl.
*H01L 27/146* (2006.01)
*H01L 31/02* (2006.01)
*H01L 31/0216* (2014.01)

(56) References Cited

U.S. PATENT DOCUMENTS

| | | | | |
|---|---|---|---|---|
| 6,468,826 | B1* | 10/2002 | Murakami | H01L 31/02327 257/225 |
| 2005/0205930 | A1* | 9/2005 | Williams | H01L 27/1463 257/E21.703 |
| 2006/0115230 | A1* | 6/2006 | Komoguchi | H01L 27/14627 385/146 |
| 2008/0237769 | A1* | 10/2008 | Okihara | H01L 27/14645 257/435 |
| 2011/0139961 | A1* | 6/2011 | An | H01L 27/14601 250/207 |
| 2012/0261547 | A1 | 10/2012 | Eisele et al. | |
| 2016/0056185 | A1* | 2/2016 | Mcleod | H01L 31/107 250/208.3 |
| 2016/0064579 | A1 | 3/2016 | Hirigoyen et al. | |
| 2016/0099371 | A1* | 4/2016 | Webster | H01L 27/1463 257/432 |
| 2016/0284743 | A1 | 9/2016 | Mellot et al. | |
| 2019/0363114 | A1* | 11/2019 | Raynor | H01L 27/14643 |
| 2020/0168748 | A1* | 5/2020 | Roehrer | H01L 31/0232 |

\* cited by examiner

SINGLE PHOTON AVALANCHE DIODE DEVICES

TECHNICAL FIELD

The present invention concerns photodiode devices and in particular single photon avalanche diodes (SPADs).

BACKGROUND

Single Photon Avalanche Diodes (SPADs) are photodiodes that are operated by applying a reverse bias that is greater than the breakdown voltage of the diode. A single charge carrier in the depletion region can thereby cause a self-sustaining avalanche through impact ionization, which enables the detection of a single photon.

After the SPAD has been triggered a current will continue to flow until the bias voltage is reduced to the breakdown voltage or below. To reduce the bias voltage, and thereby reset the SPAD, the diode can be loaded with a resistor over which the voltage drops. This is referred to as a Passive Quenching Circuit (PQC). The voltage drop V across the quenching resistor is measured and the voltage pulse is used as information that an avalanche event has happened. Without an event, the voltage of the source drops nearly completely across the diode (in reverse bias). An active quenching circuit can alternatively be used, which actively reduces the bias voltage after the SPAD has been triggered.

FIG. 1 shows a cross-section of a SPAD device 2 on a silicon substrate 4. The device has an active region 6 (also referred to as the detection region) defined by a pn-junction. Photons incident on and absorbed in the active region 6 can release charge carriers and thereby be detected. Vias 8 connect the silicon substrate 4 and the active region 6 to the first metal layer 10 of the backend stack 12 of the device 2. Further vias 14 connect the first metal layer 10 to the second metal layer 16 of the backend stack 12. The metal layers 10 and 16 are isolated from each other and from the underlying silicon substrate 4 by layers of silicon oxide 18.

After the absorbing of a photon, a SPAD cannot be activated again for a certain time (known as the "dead time"). The counting rate of a SPAD, at a low rate of absorbed photons, is substantially linear (i.e. proportional to the photon absorption rate). At high light intensities, where the photon absorption rate is close to the inverse dead time, the SPAD starts to saturate and the response becomes non-linear. Hence, the efficiency of a SPAD can decrease greatly at high light intensities, and SPAD devices therefore have a limited dynamic range (over which it generates a linear response), typically about 4 orders of magnitude. Other photodiodes can have a dynamic range of about 12 orders of magnitude, and the human eye has 14 orders (5-6 without adaption). Natural light conditions have 15 orders of magnitude and artificial light can reach even more than that.

As SPADs can detect single photons, the lower limit is typically not an issue in terms of working range, but the higher light intensities lead to saturation, because of the limited count cycles (dead time). To address this problem, a less sensitive SPAD can be used to extend the usable dynamic range. Two (or more) SPAD devices that have shifted working ranges can be built together (e.g. in a silicon photomultiplier, SiPM) to allow operation with a higher dynamic range.

US2016/064579 describes a SPAD device having radiation blocking ring surrounding the active area of the SPAD and a radiation blocking cover configured to shield part of the active region from the incident radiation. The blocking cover may be a metal layer with apertures, wherein only photons that pass through the apertures are detected. The effect of this attenuation is to reduce the number of photons detected by the SPAD, so that the SPAD does not need to reset as often and thereby maintaining linearity at higher incident light intensities.

US2012/0261547 describes the use of a transmission element with variable photon absorption properties arranged upstream in the light path of a photon-sensitive element. This allows the intensity of light reaching the element to be varied, thereby extending the working range of the device.

Using the known techniques, a reduction of the sensitivity (i.e. the photon detection probability, PDP) of a SPAD device by more than 1 to 2 orders of magnitude is difficult to achieve practically. For example, to achieve a 2 order of magnitude reduction of PDP, the aperture opening must be 1% of the optical active area of the device, which can be difficult to manufacture.

SUMMARY OF THE INVENTION

Aspects of the present invention provide SPAD devices and methods of manufacturing such as set out in the appended claims.

Preferred embodiments of the invention are described below with reference to the accompanying drawings.

DETAILED DESCRIPTION

It is well known in the art that an aperture above the active region is required to allow a portion of incident light to enter the active region of the photodiode in order to trigger the avalanche current. However, surprisingly, the inventors have discovered that a SPAD with a blocking structure, which blocks (i.e. reflects and/or absorbs) all light that would be directly incident upon the active region, can still produce an output and be used for detecting photons. Sufficient light absorbed by the silicon outside of the active region causes electron-hole pairs to reach the active region due to the long carrier lifetime of the electron-hole pairs, thus causing counts. SPAD devices are usually "small" in diameter (e.g. a few tens of μm) and thus the light generated carriers from the surroundings/periphery can contribute sufficiently to the sensitivity. Hence, SPAD devices according to embodiments described herein can provide an extended dynamic range. Embodiments described herein can be particularly useful for providing devices with a 4 to 8 orders of magnitude reduction in sensitivity (PDP). Such a low sensitivity is difficult to achieve with an aperture, as such small apertures can be extremely hard to realize and there is a significant incident angle dependency.

Figure 1:
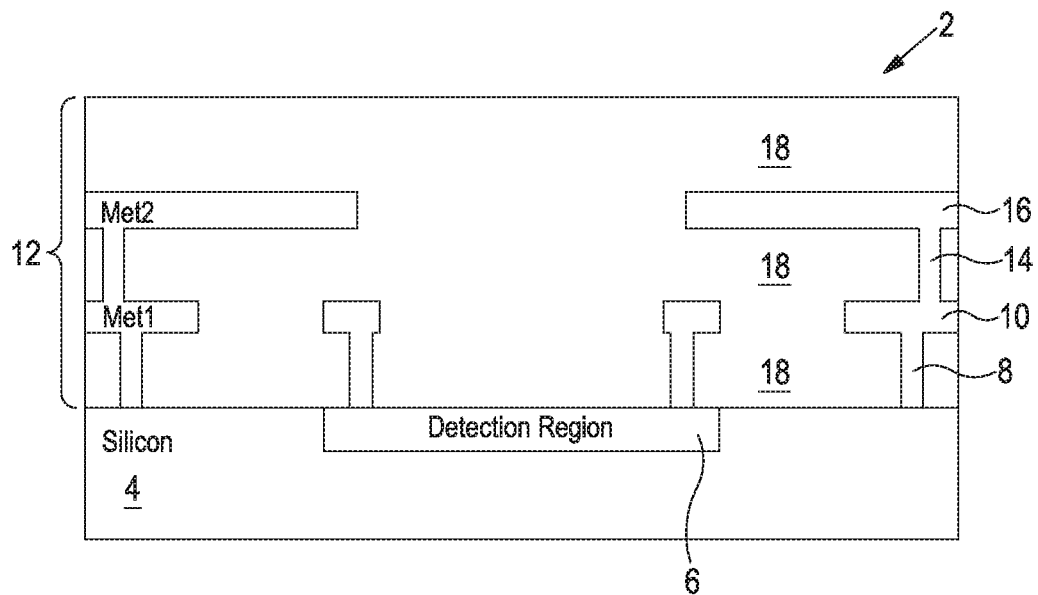
FIG. 1 is a schematic diagram of a cross-section of a SPAD device.
Figure 2:
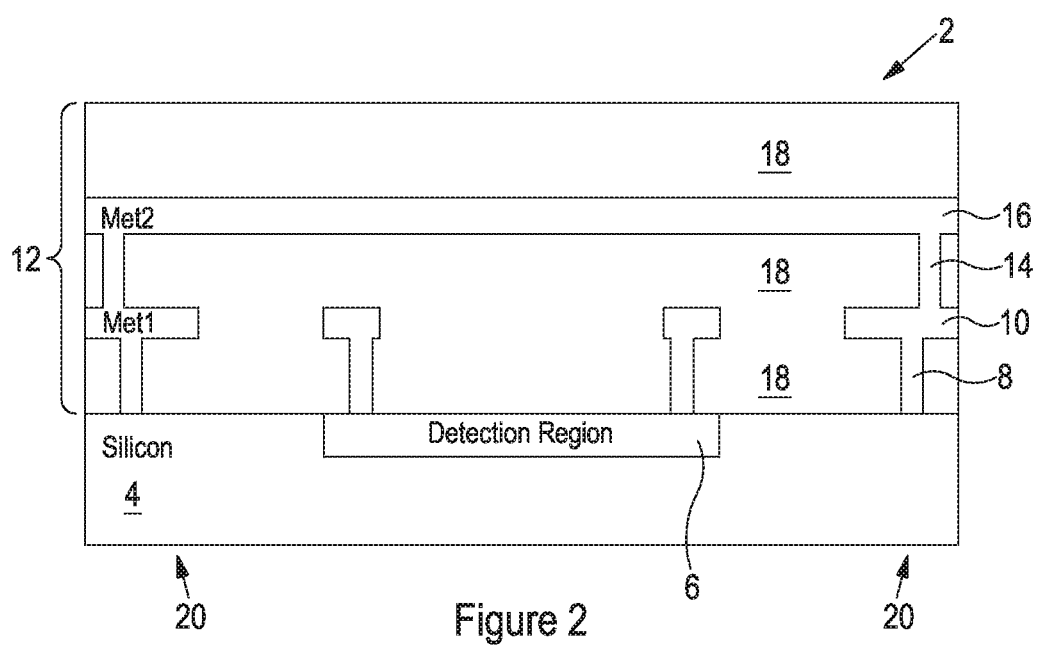
FIG. 2 is a schematic diagram of a cross-section of a SPAD device according to an embodiment having a blocking structure comprising a continuous metal layer.

FIG. 2 shows a schematic diagram of a cross-section of a SPAD device 2 according to an embodiment. Similar features in the figures have been given the same reference numerals to aid understanding and are not meant to be limiting. The SPAD device 2 comprises a silicon substrate 4, an active region 6 (also referred to as "detection region") defined by a pn-junction, and a first metal layer 10 in a backend stack 12 of the device 2. The first metal layer is connected to the silicon substrate 4 and the active region 6 by vias 8, and further vias 14 connect the first metal layer 10 to a second metal layer 16. The metal layers 10 and 16 are isolated from each other and from the underlying silicon substrate 4 by isolating layers 18 (typically $SiO_2$). Importantly, the second metal layer 16 forms a blocking structure, which prevents incident photons from reaching the active region 6. Any photon which would be directly incident on the active region 6 of the device 2 is reflected (or absorbed) by the second metal layer 16, which thereby significantly reduces the sensitivity of the device 2. The sensitivity is normally quantified by the photon detection probability (PDP). The blocking structure creates an intentionally low PDP SPAD 2. The second metal layer 16 extends over a part of the peripheral region 20 (i.e. the region outside of the detection region 6) of the device 2. Further away from the active region 6, the coverage of the second metal layer 16 is reduced (e.g. intermittent) (not shown), allowing photons to reach the silicon 4 outside of the active region 6. Mile the active region 6 is suitable for detecting light incident upon it, the blocking structure (in this case the second metal layer 16) prevents any light from directly reaching the active region 6. Instead the device 2 indirectly detects light by detecting charge carriers generated by light in the silicon 4 outside the active region 6 that then enter the active region 6 by lateral movement.

Figure 3:
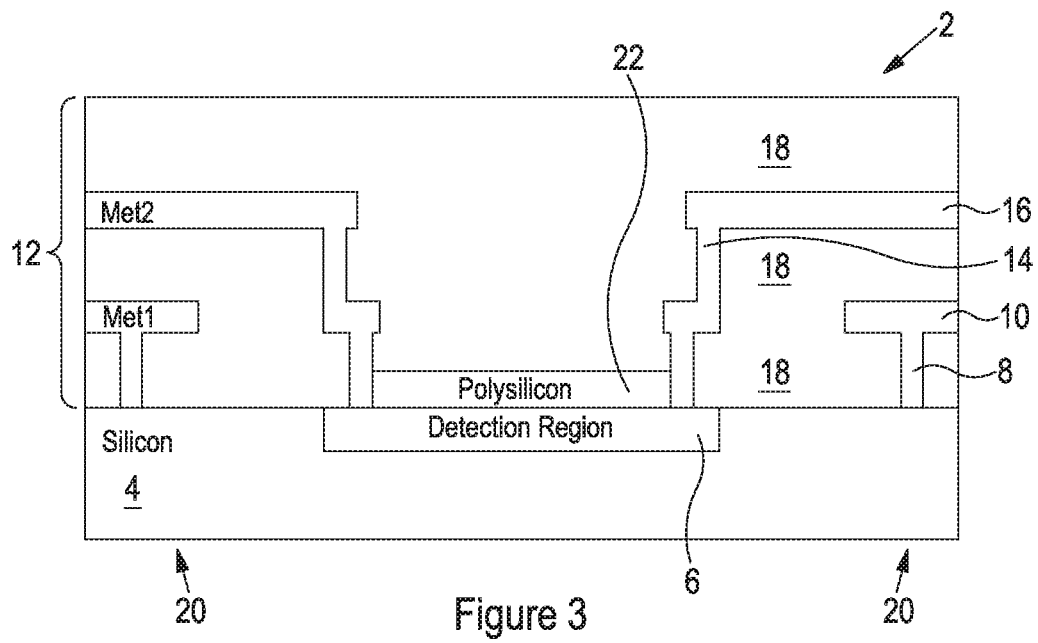
FIG. 3 is a schematic diagram of a cross-section of a SPAD device according to an embodiment having a blocking structure comprising a polysilicon layer.

FIG. 3 shows a schematic diagram of a cross-section of a SPAD device 2 according to another embodiment. The SPAD device 2 comprises a silicon substrate 4, an active region 6, and a first metal layer 10 in a backend stack 12 of the device 2. The first metal layer is connected to the silicon substrate 4 and the active region 6 by vias 8 and further vias 14 connect the first metal layer 10 to a second metal layer 16. The metal layers 10 and 16 are isolated from each other and from the underlying silicon substrate 4 by isolating layers 18 (typically $SiO_2$). A polysilicon layer 22 covers the active region 6. The polysilicon layer 22 can absorb incident photons to prevent photons from entering the active region 6, thereby reducing the sensitivity of the device 2. Polysilicon layer 22 can have a thickness in the range of 70 nm to 350 nm. Preferably the polysilicon layer 22 is formed in the normal "POLY" step of a CMOS process, thereby avoiding the need for a new, dedicated, process step. The edges of the active region 6 are not covered by the polysilicon layer 22, but are covered by the first metal layer 10 and the second metal layer 16, which reflect any photons that would otherwise have been incident upon the edge of the active region 6. The first metal layer 10, the second metal layer 16 and the polysilicon layer 22 together form a blocking structure, which overlaps the whole of the active region. The blocking structure does not contain any apertures which allow light travelling vertically, i.e. perpendicular to the plane of the silicon 4, to reach the active region 6 directly. The SPAD may still contribute to the count rate by detecting charge carriers from photons absorbed in the silicon 4 outside the active region 6. Also, some light may be reflected between the first and second metal layers 10 and 16, and thereby reach the silicon 4. Polysilicon transmits low frequency light ($\lambda > 400$ nm) and may therefore not be suitable in a blocking structure for some low frequency applications. The embodiment can be used to at least block light having a wavelength in the range of about 200 nm to about 400 nm. Other embodiments, such as the SPAD device illustrated in FIG. 2, having a continuous metal layer overlapping the active region, can be used over a wider range of wavelengths.

In other embodiments, a polysilicon layer 22 may be used on its own as a blocking structure or together with a part of either one of the first metal layer 10 or the second metal layer 16 to provide a continuous cover. The vias 8 and 14 may also form a part of the blocking structure.

Figure 4:
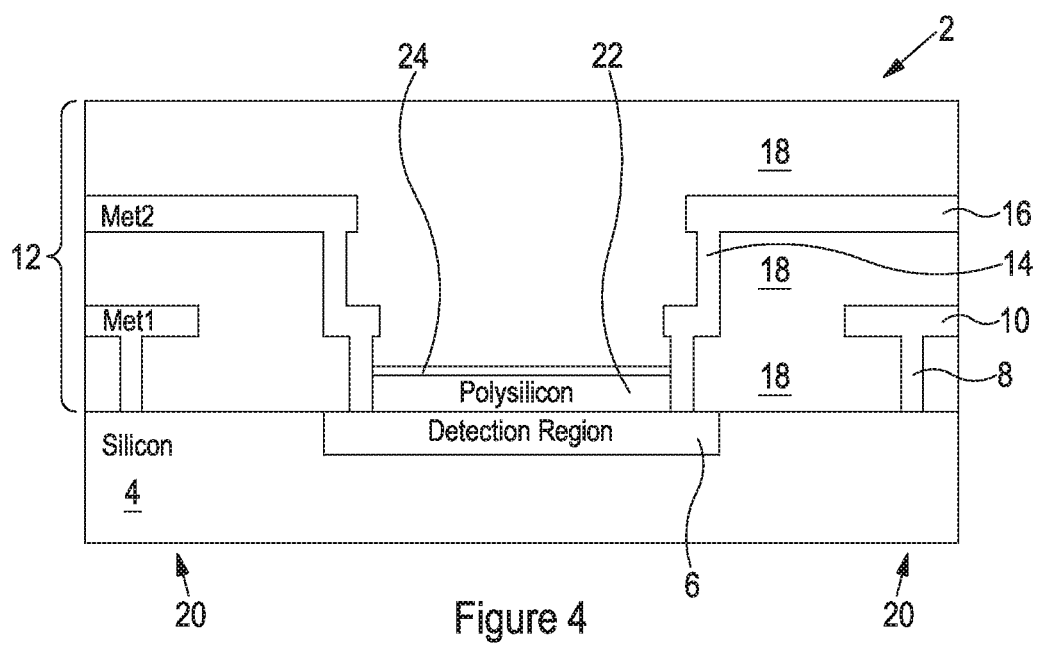
FIG. 4 is a schematic diagram of a cross-section of a SPAD device according to an embodiment having a blocking structure comprising a salicide layer.

FIG. 4 shows a schematic diagram of a cross-section of a SPAD device 2 according to an embodiment. The SPAD device 2 is similar to that shown in FIG. 3 and comprises a polysilicon layer 22 overlapping the active region 6 of the device 2. Directly on top of the polysilicon layer 22 is a salicide layer 24 (i.e. a metal silicide formed in a salicide process). The salicide layer 24 can have the added benefit of also blocking IR light. Preferably, the salicide layer 24 is formed after the normal gate formation sequence of a CMOS process.

The PDP of the SPAD can be modified/controlled by the inclusion of guard rings (reverse biased junctions) surrounding the SPAD. The guard rings can decrease the number of charge carriers that enter the active region from photons absorbed in the peripheral region or beyond, thereby further decreasing the sensitivity of the SPAD device.

Deep trench isolation or silicon on insulator (SOI) technology can also be used to hinder the passage of light generated carriers from the peripheral region to the active region of the SPAD to further reduce the sensitivity.

Figure 5:
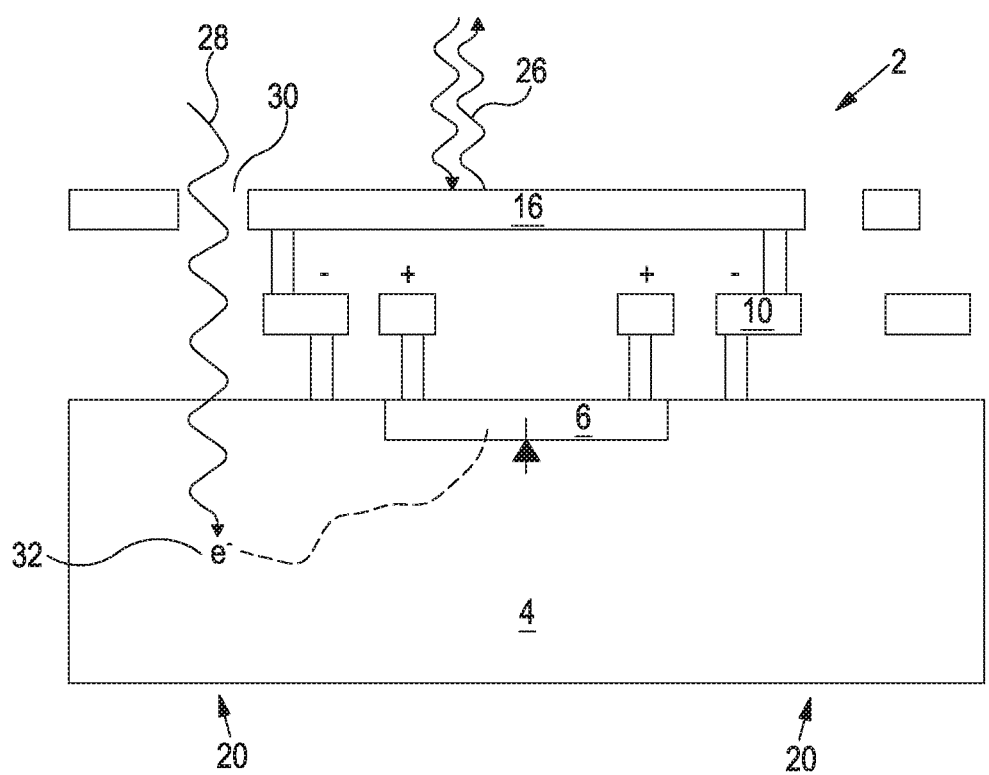
FIG. 5 is a schematic diagram of a cross-section of a SPAD device according to an embodiment.

FIG. 5 shows a schematic diagram of a SPAD device 2 according to an embodiment when the device 2 is in operation. A continuous part of the second metal layer 16 overlaps the active region 6 and reflects light 26 that would otherwise have been directly incident upon the active region 6. In the peripheral region 20 of the SPAD device 2, light 28 reaches the silicon substrate 4 via gaps 30 in the metal layers 10 and 16. The light 28 is absorbed in the silicon 4 and excites an electron 32 and a hole (not shown). The electron 32 diffuses through the silicon 4 and eventually reaches the active region 6 where it causes a count due to the large reverse bias applied to the active region 6 (i.e. applied across the photodiode of the SPAD device 2).

Figure 6:
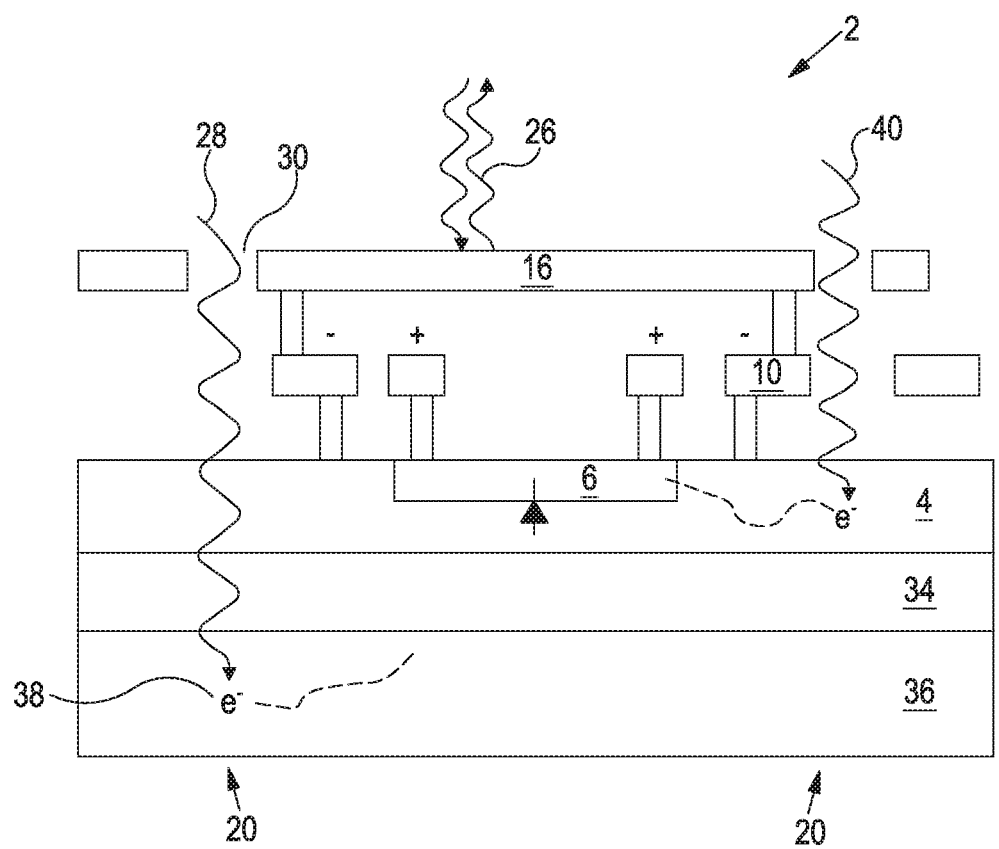
FIG. 6 is a schematic diagram of a cross-section of a SPAD device according to an embodiment having a silicon on insulator (SOI) structure.

FIG. 6 shows a schematic diagram of another embodiment of a SPAD device 2 in operation, having a silicon on insulator (SOI) structure for further reducing the sensitivity of the SPAD device 2. The silicon substrate 4 is located on an insulator layer 34 (e.g. $SiO_2$), which in turn rests on another silicon substrate 36. Light 28 absorbed in the lower silicon substrate 36 cannot cause counts, as excited charge carriers cannot cross the insulator layer 34. An electron 32, excited by the incident light 28, diffuses a distance in the silicon 36 before undergoing recombination. Light 40 absorbed in the upper silicon substrate 4 can still cause counts.

Figure 7:
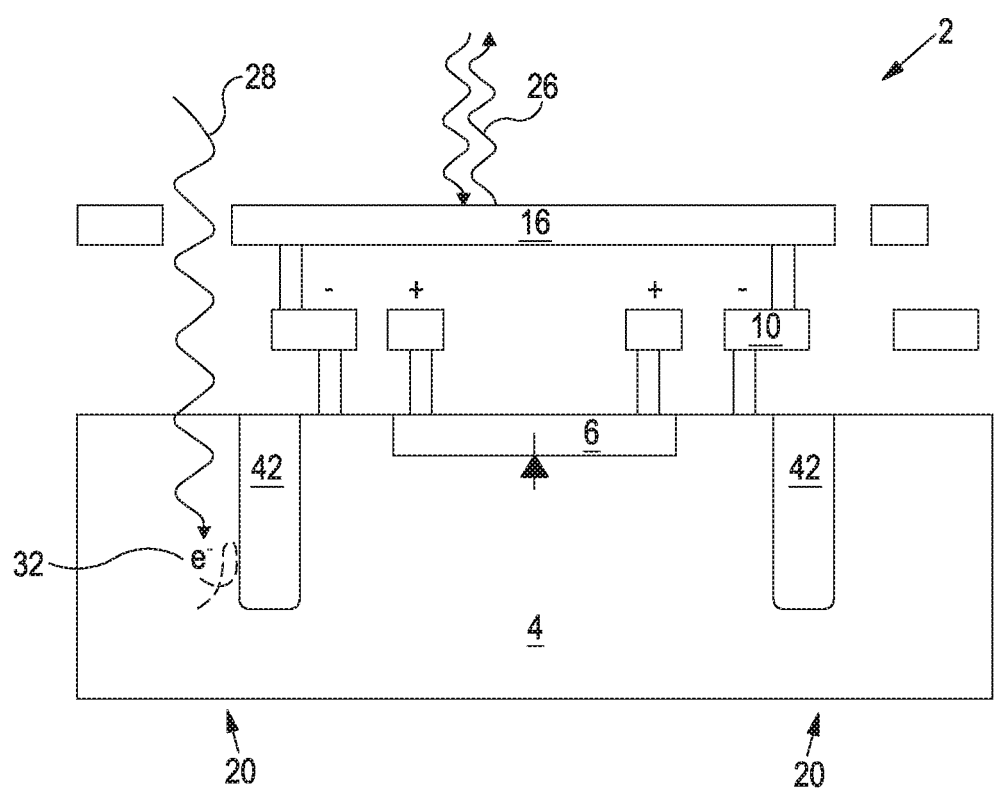
FIG. 7 is a schematic diagram of a cross-section of a SPAD device according to an embodiment having a deep trench isolation structure.

FIG. 7 shows a schematic diagram of another embodiment of a SPAD device 2 in operation, having a deep trench isolation structure. A deep trench 42 filled with an insulating material prevents some charge carriers from diffusing to the active region 6, and thereby reduces the sensitivity of the SPAD device 2.

Figure 8:
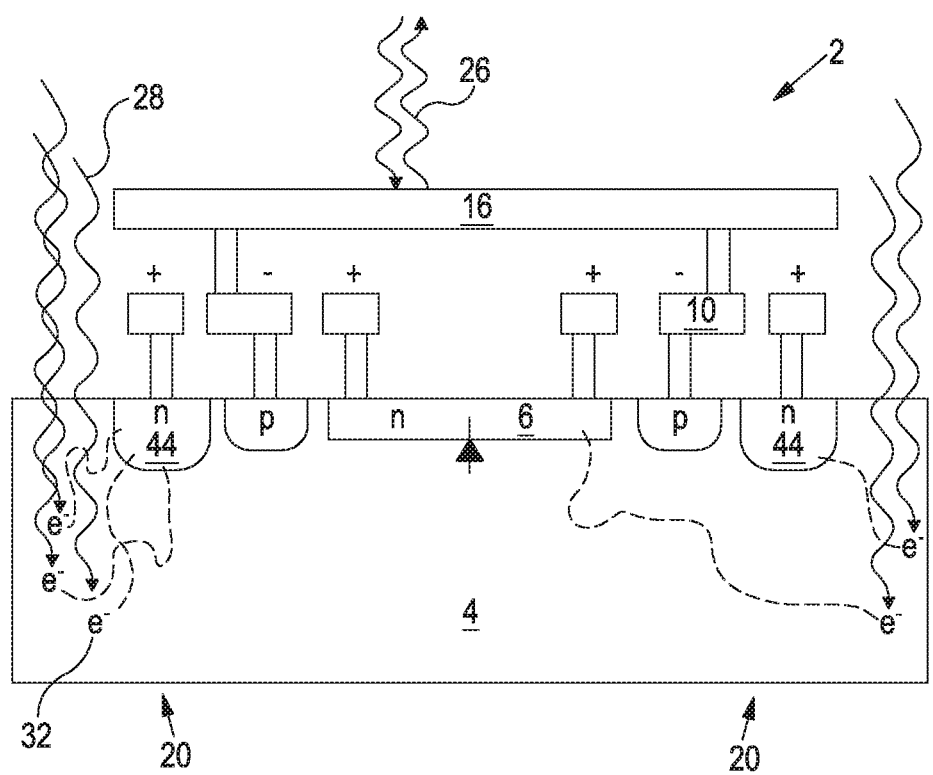
FIG. 8 is a schematic diagram of a cross-section of a SPAD device according to an embodiment having a guard ring.

FIG. 8 shows a schematic diagram of a SPAD device 2 according to another embodiment when the device 2 is in operation. A guard ring 44 surrounds the active region 6 and prevents charge carriers from reaching the active region 6, thereby reducing the sensitivity of the SPAD device 2. The guard ring 44 is an n-doped well connected to a positive bias, which attracts the free electrons 32. Some charge carriers may diffuse underneath the guard ring 44 and to the active region 6 and thereby cause counts.

FIGS. 6, 7 and 8 show embodiments having a blocking structure being a continuous metal layer (the second metal layer 16) combined with other features (SOI, deep trench isolation and guard rings) for further reducing the sensitivity of the SPAD device 2. Any one or more of these other features can also be used with the polysilicon layer 22 blocking structure shown in FIGS. 3 and 4.

The overlap of the metal cover (extending into the peripheral region) can be used to modify the response. By making the metal cover wider, so that it extends further into the peripheral region, the sensitivity of the SPAD can be further reduced. The metal layer may extend a distance beyond the active region in the range of 1 µm to 1000 µm.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

The invention claimed is:

1. A single photon avalanche diode (SPAD) device comprising:
    a silicon layer;
    an active region in said silicon layer for detecting incident light and defined by a pn-junction; and
    a blocking structure completely overlapping said active region for blocking incident light having a wavelength at least in the range of 200 nm to 400 nm, so that light having said wavelength can only be detected by said SPAD device when incident upon a region of said silicon layer outside of said active region.

2. A SPAD device according to claim 1, wherein said blocking structure comprises a continuous metal layer overlapping said active region.

3. A SPAD device according to claim 2, wherein said continuous metal layer further overlaps a peripheral region of said SPAD device extending a distance outside of said active region, said distance being in the range of 1 µm to 1000 µm.

4. A SPAD device according to claim 2, wherein said metal layer is the second metal layer in a CMOS backend stack of the SPAD device.

5. A SPAD device according to claim 1, wherein said blocking structure comprises a continuous polysilicon layer.

6. A SPAD device according to claim 5, wherein said polysilicon layer has a thickness in the range 70 nm to 350 nm.

7. A SPAD device according to claim 5, wherein said blocking structure further comprises a part of a metal layer.

8. A SPAD device according to claim 5, wherein said SPAD device is a CMOS device and said polysilicon layer was formed using a POLY mask in a CMOS process.

9. A SPAD device according to claim 5, wherein said blocking structure further comprises a salicide layer formed on said polysilicon layer.

10. A SPAD device according to claim 1, and further comprising a silicon on insulator (SOI) structure for reducing the sensitivity of said SPAD device.

11. A SPAD device according to claim 1, and further comprising deep trench isolation for reducing the sensitivity of said SPAD device.

12. A SPAD device according to claim 1, and further comprising a guard ring for reducing the sensitivity of said SPAD device.

13. A method of manufacturing a single photon avalanche diode (SPAD) device comprising:
    providing a silicon layer;
    forming an active region in said silicon layer for detecting incident light;
    forming a blocking structure overlapping said active region for blocking incident light having a wavelength at least in the range of 200 nm to 400 nm, so that light having said wavelength can only be detected by said SPAD device when incident upon a region of said silicon layer outside of said active region.

14. A method according to claim 13, wherein said step of forming a blocking structure comprises depositing a continuous metal layer overlapping said active region.

15. A method according to claim 14, wherein said continuous metal layer further overlaps a peripheral region of said SPAD device extending a distance outside of said active region, said distance being in the range of 1 µm to 1000 µm.

16. A method according to claim 14, wherein said step of depositing said continuous metal layer is performed in a CMOS back-end-of-line (BEOL) process and wherein said continuous metal layer is the second metal layer in a CMOS backend stack of the SPAD device.

17. A method according to claim 13, wherein said step of forming said blocking structure comprises depositing a polysilicon layer and patterning said polysilicon layer so as to cover at least a part of said active region.

18. A method according to claim 17, wherein said polysilicon layer has a thickness in the range 70 nm to 350 nm.

19. A method according to claim 17, wherein said steps of patterning said polysilicon layer is performed using the POLY mask in a CMOS process.

20. A method according to claim 17, wherein said step of forming said blocking structure further comprises forming a salicide layer on said polysilicon layer.

* * * * *